(12) United States Patent
Shih et al.

(10) Patent No.: US 11,871,538 B2
(45) Date of Patent: Jan. 9, 2024

(54) LIQUID COOLING DEVICE

(71) Applicant: COOLER MASTER CO., LTD., New Taipei (TW)

(72) Inventors: Shun-Yu Shih, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 118 days.

(21) Appl. No.: 17/205,992

(22) Filed: Mar. 18, 2021

(65) Prior Publication Data

US 2022/0030746 A1 Jan. 27, 2022

(30) Foreign Application Priority Data

Jul. 24, 2020 (TW) ................................. 109125058

(51) Int. Cl.
*H05K 7/20* (2006.01)
*G06F 1/20* (2006.01)

(52) U.S. Cl.
CPC ....... *H05K 7/20272* (2013.01); *H05K 7/2039* (2013.01); *G06F 1/20* (2013.01); *G06F 2200/201* (2013.01)

(58) Field of Classification Search
CPC .... H05K 7/20272; H05K 7/2039; G06F 1/20; G06F 2200/201

USPC ........................................................ 165/80.4
See application file for complete search history.

(56) References Cited

U.S. PATENT DOCUMENTS

| | | | | |
|---|---|---|---|---|
| 9,062,919 | B2* | 6/2015 | Hanafusa | F28F 9/0209 |
| 9,818,671 | B2* | 11/2017 | Huang | H01L 23/467 |
| 10,041,710 | B2* | 8/2018 | Morimoto | F28F 27/02 |
| 2007/0070604 | A1* | 3/2007 | Tomioka | F28D 1/05325 |
| | | | | 165/80.4 |
| 2007/0175610 | A1* | 8/2007 | Yeh | H01L 23/473 |
| | | | | 257/E23.098 |
| 2011/0186277 | A1* | 8/2011 | Hanafusa | F28F 9/02 |
| | | | | 165/173 |
| 2019/0364694 | A1* | 11/2019 | Lin | H01L 23/473 |
| 2020/0166976 | A1* | 5/2020 | Lin | G06F 1/1632 |
| 2021/0048256 | A1* | 2/2021 | Xiao | H01L 23/467 |
| 2022/0030746 | A1* | 1/2022 | Shih | H05K 7/2039 |
| 2022/0087063 | A1* | 3/2022 | Shih | H05K 7/20272 |

\* cited by examiner

*Primary Examiner* — Claire E Rojohn, III
(74) *Attorney, Agent, or Firm* — Maschoff Brennan

(57) ABSTRACT

A liquid cooling device is configured to be in fluid communication with a heat absorbing component. The liquid cooling device includes a first tank, a second tank, a third tank, and a channel structure. The second tank has a first connector, the third tank has a second connector, and the first connector and the second connector are configured to be in fluid communication with the heat absorbing component via pipes. The second tank and the third tank are in fluid communication with the first tank via the channel structure. Orthogonal projections of the second tank and the third tank onto the first tank do not overlap with each other.

22 Claims, 12 Drawing Sheets

LIQUID COOLING DEVICE

CROSS-REFERENCE TO RELATED APPLICATIONS

This non-provisional application claims priority under 35 U.S.C. § 119(a) on patent application No(s). 109125058 filed in Taiwan, R.O.C on Jul. 24, 2020, the entire contents of which are hereby incorporated by reference.

Technical Field

The disclosure relates to a liquid cooling device and a liquid cooling system, more particularly to a liquid cooling device and a liquid cooling system having a plurality of tanks.

Background

As technology develops and progresses, computers have been widely used in daily life. And most of the motherboard has multiple expansion ports for the insertion of various types of expansion card, such as a graphic card, a sound card, a network card, in order to add functionality or improve performance. However, the internal space is very limited thus sometimes it would be hard to install all the wanted cards without having physical interferences. Meanwhile, the operations of the expansion cards will generate waste heat in the compact space, thus it needs to timely and effectively dissipate the heat to prevent overheating of or damage to the expansion cards and other electronic components around.

Liquid cooling is a typical solution for dissipating heat of expansion cards. Generally, a liquid cooling system consists of a heat absorbing component, a heat exchanger, and a pump, where the pump can force coolant to flow through the heat absorbing component to absorb and take away the heat generated by the expansion card, and the high-temperature coolant is pumped to the heat exchanger to dissipate heat to outside. To adapt to the compact internal arrangement of computer or server, the overall volume of the liquid cooling system is demanded to be small.

However, the size reduction of liquid cooling system may affect the heat dissipation performance. Therefore, it is desirable to develop a liquid cooling system that is small in size and high in heat dissipation performance.

SUMMARY

The disclosure provides a liquid cooling device and a liquid cooling system that have an improved heat dissipation performance while having a small volume.

One embodiment of the disclosure provides a liquid cooling device. The liquid cooling device is configured to be in fluid communication with a heat absorbing component. The liquid cooling device includes a first tank, a second tank, a third tank, and a channel structure. The second tank has a first connector, the third tank has a second connector, and the first connector and the second connector are configured to be in fluid communication with the heat absorbing component via pipes. The second tank and the third tank are in fluid communication with the first tank via the channel structure. Orthogonal projections of the second tank and the third tank onto the first tank do not overlap with each other.

Another embodiment of the disclosure provides a liquid cooling device. The liquid cooling device is configured to be in fluid communication with a heat absorbing component. The liquid cooling device includes a first tank, a second tank, a third tank, and a channel structure. The second tank has a first connector, the third tank has a second connector, and the first connector and the second connector are configured to be in fluid communication with the heat absorbing component via pipes. The second tank and the third tank are in fluid communication with the first tank via the channel structure. A distance between the second tank and the first tank is larger than a distance between the third tank and the first tank, and a length of the third tank is smaller than a maximum width of the channel structure.

Still another embodiment of the disclosure provides a liquid cooling device. The liquid cooling device is configured to be in fluid communication with a heat absorbing component. The liquid cooling device includes a first tank, a second tank, a third tank, and a channel structure. The second tank has a first connector, the third tank has a second connector, the first connector and the second connector are configured to be in fluid communication with the heat absorbing component via pipes. The second tank and the third tank are in fluid communication with the first tank via the channel structure. The channel structure is not located between the second tank and the third tank.

Yet another embodiment of the disclosure provides a liquid cooling device. The liquid cooling device is configured to be in fluid communication with a heat absorbing component. The liquid cooling device includes a first tank, a second tank, a third tank, and a channel structure. The second tank has a first connector, the third tank has a second connector, the first connector and the second connector are configured to be in fluid communication with the heat absorbing component via pipes. The second tank and the third tank are in fluid communication with the first tank via the channel structure. The channel structure has a recess, the third tank is entirely located in the recess, and the recess is configured to accommodate the heat absorbing component.

Still yet another embodiment of the disclosure provides a liquid cooling device. The liquid cooling device is configured to be in fluid communication with a heat absorbing component. The liquid cooling device includes a first tank, a second tank, a third tank, and a channel structure. The second tank has a first connector, the third tank has a second connector, the first connector and the second connector are configured to be in fluid communication with the heat absorbing component via pipes. The second tank and the third tank are in fluid communication with the first tank via the channel structure. The third tank is located between the first tank and the second tank, and the third tank only has one side directly in fluid communication with the channel structure.

Still yet another embodiment of the disclosure provides a liquid cooling system. The liquid cooling system includes a heat absorbing component, the aforementioned liquid cooling device and two pipes. The liquid cooling device is in fluid communication with the heat absorbing component via the pipes.

As the liquid cooling devices and the liquid cooling systems discussed in the above embodiments, the second tank and the third tank are in fluid communication with the first tank via the channel structure, and the orthogonal projections of the second tank and the third tank onto the first tank do not overlap with each other, such that the second tank and the channel structure are not located at a side of the third tank located away from the first tank. Thus, the second tank is in fluid communication with the side of the third tank located close to the first tank via the channel structure and the first tank instead of being in direct fluid communication with the side of the third tank located away from the first tank. This ensures that the coolant flowing through the third tank is low-temperature, preventing the converging of high-temperature and low-temperature coolant from existing in the third tank. Therefore, the turbulence due to interaction of high and low temperature coolant is prevented, improving the heat dissipation performance of the liquid cooling device.

In addition, the distance between the second tank and the first tank is larger than the distance between the third tank and the first tank, and the length of the third tank is smaller than the maximum width of the channel structure, such that there is a room formed between the second tank and the third tank to accommodate the heat absorbing component. As such, it prevents the converging of high-temperature and low-temperature coolant from existing in the third tank. Therefore, the turbulence due to interaction of high and low temperature coolant is prevented, improving the heat dissipation performance of the liquid cooling device.

On the other hand, the third tank is located at the recess, and the second tank and the third tank are spaced apart from each other by a gap, such that it prevents the converging of high-temperature and low-temperature coolant from existing in the third tank. Therefore, the turbulence due to interaction of high and low temperature coolant is prevented, improving the heat dissipation performance of the liquid cooling device.

In some of the embodiments, the heat absorbing component can be arranged within the recess of the channel structure, achieving a small volume and compact arrangement of the liquid cooling system.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
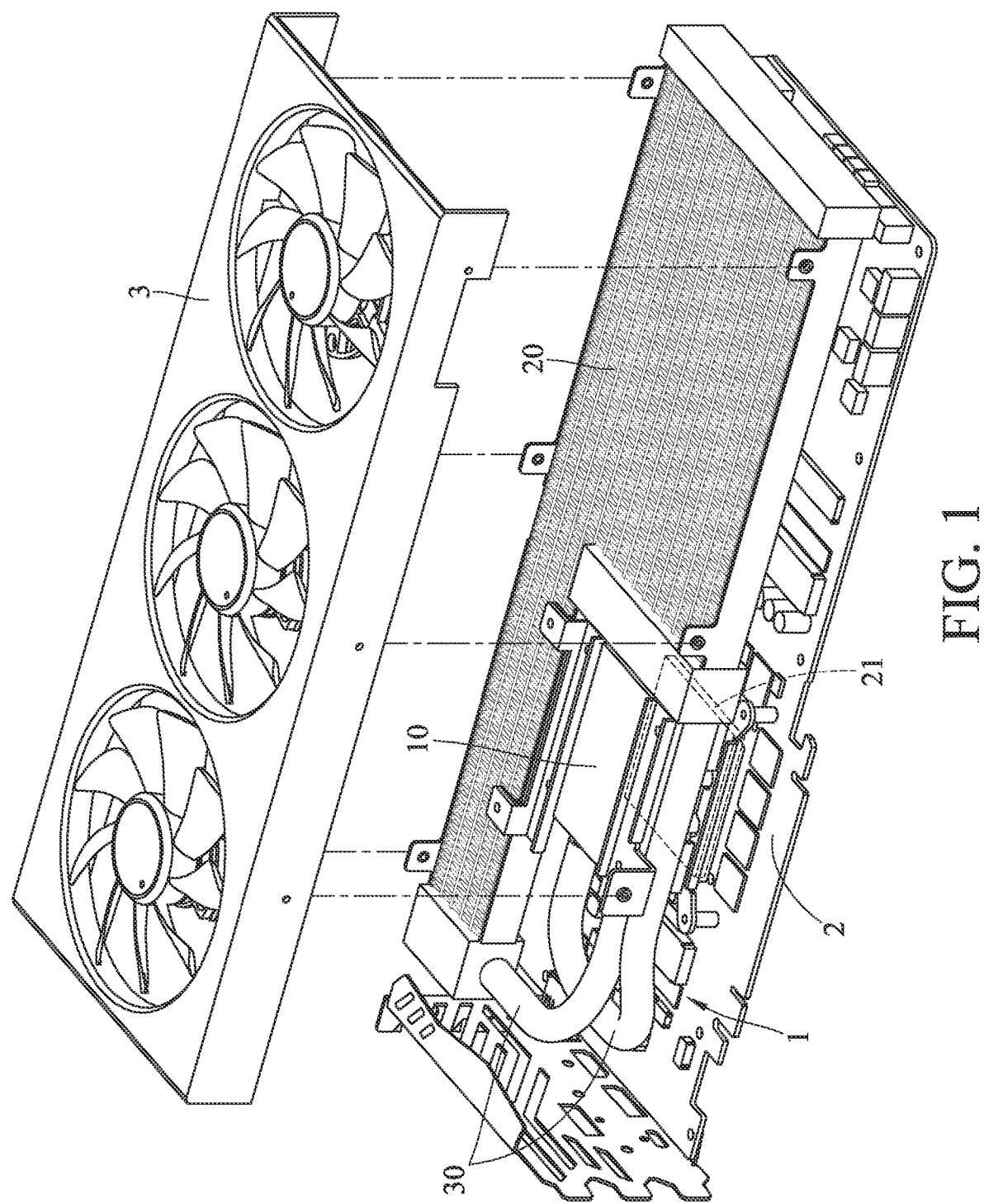
FIG. 1 is an exploded view of a liquid cooling system, an electronic device, and a fan device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
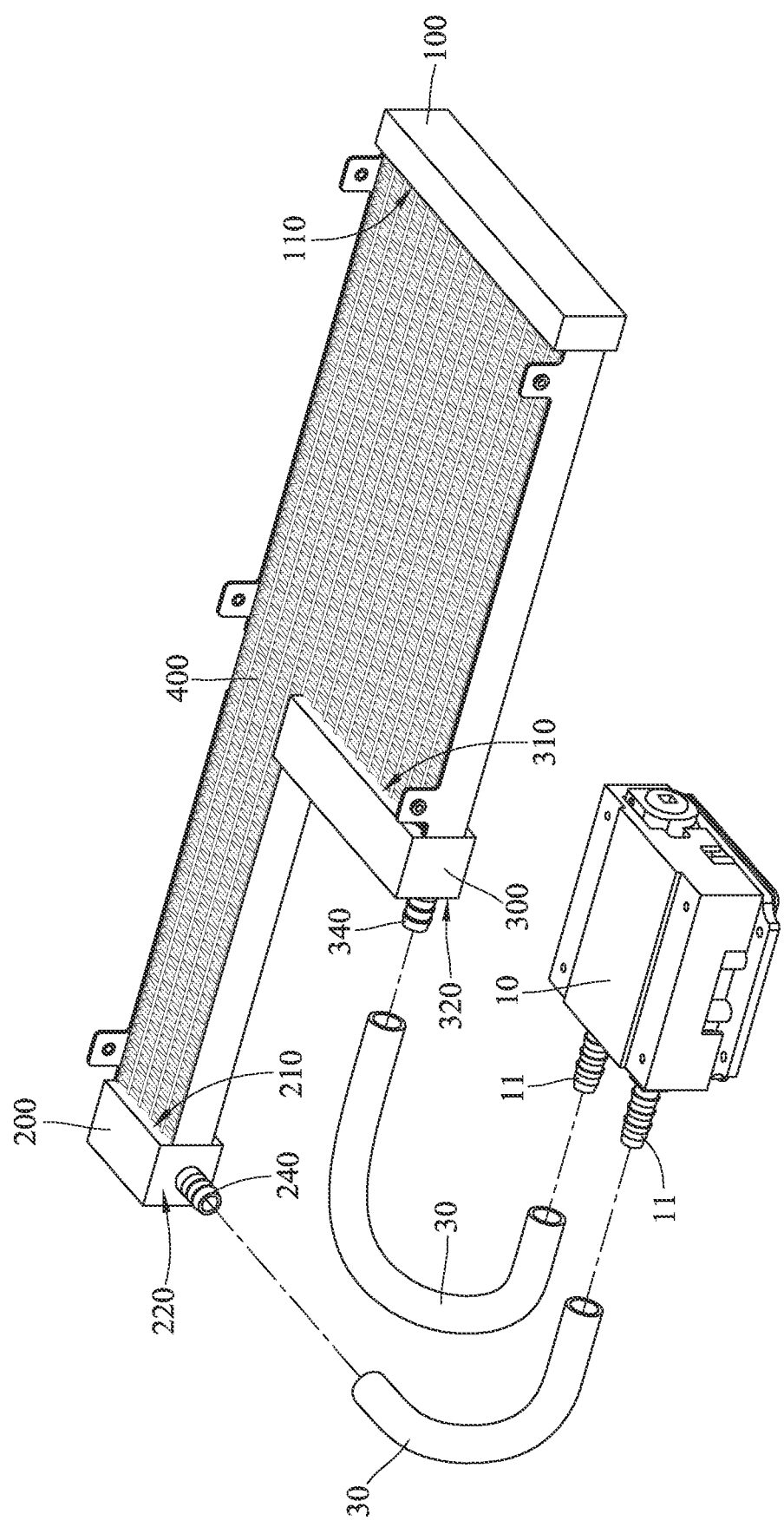
FIG. 2 is an exploded view of the liquid cooling system in FIG. 1.
Figure 3:
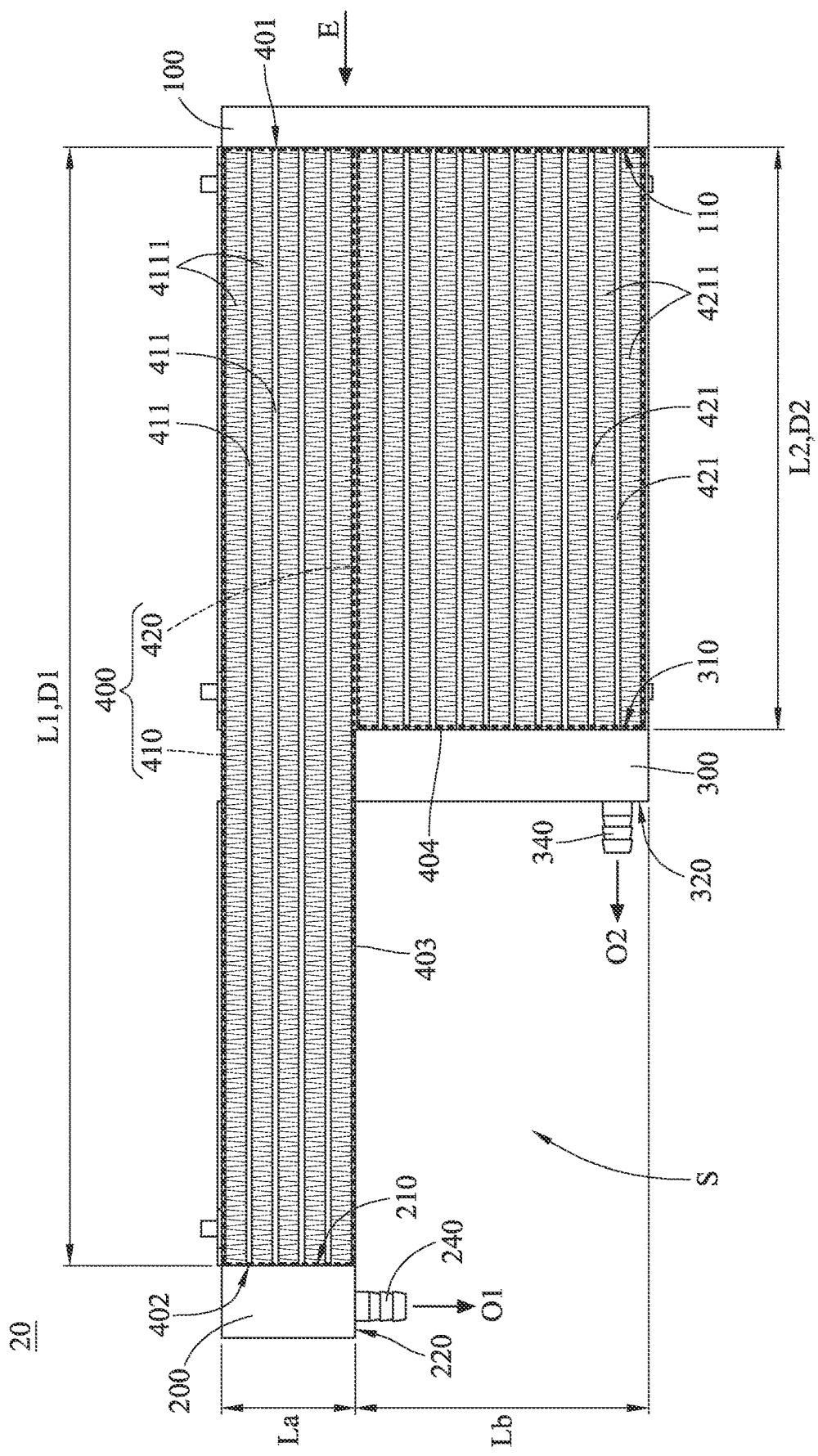
FIG. 3 is a schematic view of a liquid cooling device of the liquid cooling system in FIG. 2.

Referring to FIGS. 1 to 4, there are shown an exploded view of a liquid cooling system 1, an electronic device 2, and a fan device 3 according to a first embodiment of the disclosure, an exploded view of the liquid cooling system 1 in FIG. 1, a schematic view of a liquid cooling device 20 of the liquid cooling system 1 in FIG. 2, and a cross-sectional view of the liquid cooling device 20 in FIG. 3.

As shown in FIG. 1, the liquid cooling system 1 includes a heat absorbing component 10, a liquid cooling device 20, and two pipes 30. The pipes 30 are in fluid communication with the heat absorbing component 10 and the liquid cooling device 20 so that the heat absorbing component 10, the liquid cooling device 20, and the pipes 30 together from a closed loop. The heat absorbing component 10 is configured to be in thermal contact with a heat source 21 of an electronic device 2. Coolant is flowing in the loop. The coolant in the heat absorbing component 10 can absorb heat generated by the heat source 21, and the heat contained in the coolant is dissipated to outside when it reaches the liquid cooling device 20. The coolant is, for example, water or refrigerant. The electronic device 2 is, for example, an expansion card, such as a graphic card. In addition, the liquid cooling system 1 may include a fan device 3 to create air flow to take the heat away from the liquid cooling device 20.

Figure 4:
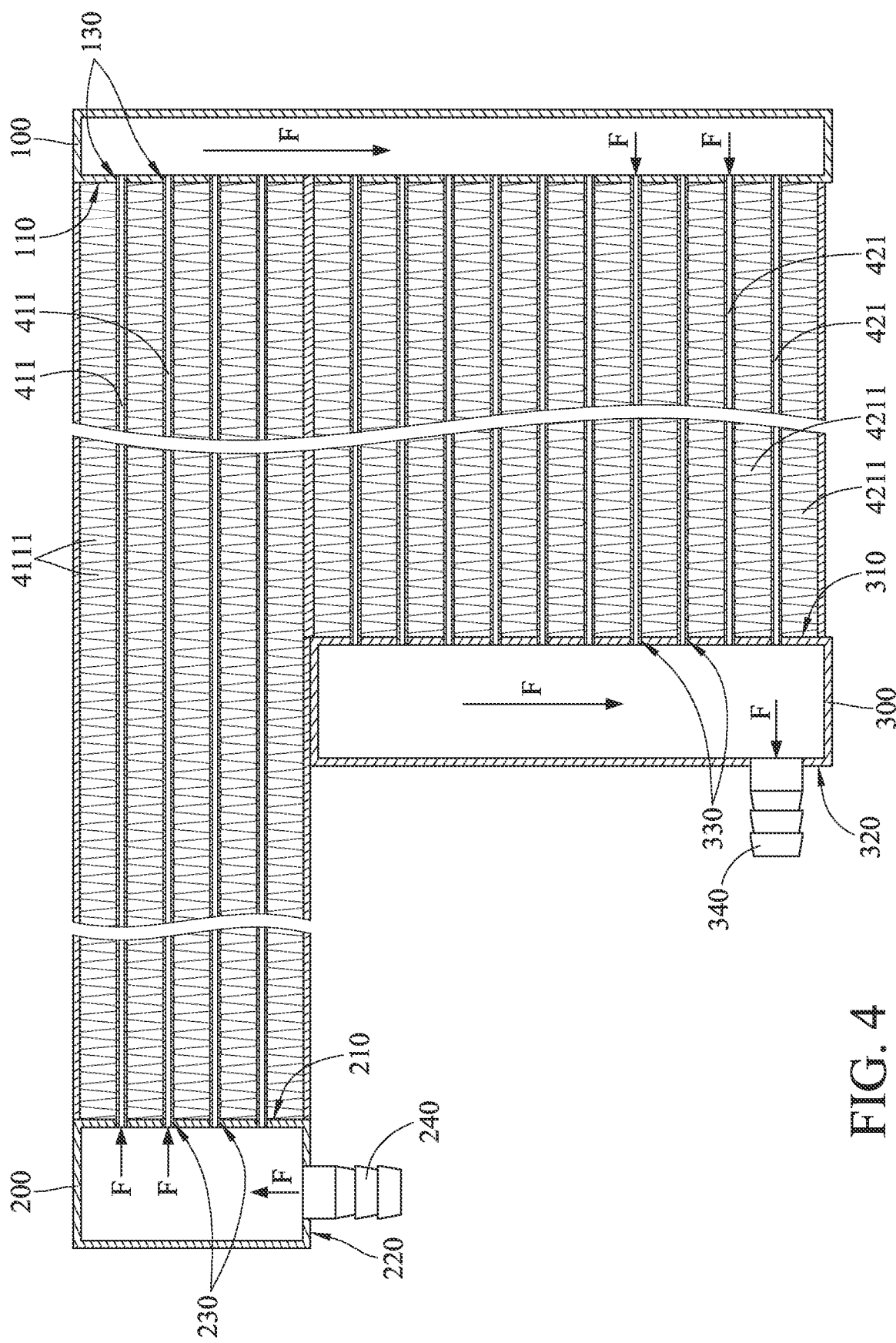
FIG. 4 is a cross-sectional view of the liquid cooling device in FIG. 3.

As shown in FIGS. 2 to 4, the liquid cooling device 20 includes a first tank 100, a second tank 200, a third tank 300, and a channel structure 400. The first tank 100 has a surface 110 and a plurality of through holes 130 formed on the surface 110.

The second tank 200 has a first surface 210, a second surface 220, a plurality of through holes 230, and a first connector 240. The second surface 220 is adjacent to the first surface 210. The through hole 230 is formed on the first surface 210, and the first connector 240 is located at the second surface 220.

The third tank 300 has a first surface 310, a second surface 320, a plurality of through holes 330, and a second connector 340. The second surface 320 is located opposite to the first surface 310. The through holes 330 are formed on the first surface 310, and the second connector 340 is located at the second surface 320. The first connector 240 and the second connector 340 are respectively in fluid communication with two connectors 11 of the heat absorbing component 10 via pipes 30.

In this embodiment, the length La of the second tank 200 is smaller than the length Lb of the third tank 300, but the disclosure is not limited thereto; in some other embodiments, the second tank may be longer than the third tank.

The channel structure 400 has a first side 401, a second side 402, and a recess S. The recess S is recessed from the second side 402 of the channel structure 400 towards the first side 401 of the channel structure 400. The channel structure 400 further has a third side 403 and a fourth side 404 respectively located at different sides of the recess S. The first side 401 of the channel structure 400 is in fluid communication with the first tank 100. The second side 402 of the channel structure 400 is in fluid communication with the second tank 200, and the fourth side 404 of the channel structure 400 is in fluid communication with the third tank 300. As shown, the recess S is recessed from a side of the channel structure 400 located opposite to the first tank 100 towards the first tank 100. In this embodiment, the third tank 300 is entirely located in the recess S, but the disclosure is not limited thereto; in some other embodiments, the third tank may be partially located in the recess.

In this embodiment, the channel structure 400 includes a first portion 410 and a second portion 420 directly connected to each other but not directly in fluid communication with each other. The length L1 of the first portion 410 is larger than the length L2 of the second portion 420, such that the distance D1 between the second tank 200 and the first tank 100 is larger than the distance D2 between the third tank 300 and the first tank 100.

Specifically, the first portion 410 includes a plurality of first channels 411. The first channels 411 are located between and in fluid communication all of the through holes 230 of the second tank 200 and some of the through holes 130 of the first tank 100. In other words, the second tank 200 is in fluid communication with the first tank 100 via the first portion 410 of the channel structure 400. The second portion 420 includes a plurality of second channels 421. The second channels 421 are located between and in fluid communication with all of the through holes 330 of the third tank 300 and the other through holes 130 of the first tank 100. In other words, the third tank 300 is in fluid communication with the first tank 100 via the second portion 420 of the channel structure 400. As such, the second tank 200 and the third tank 300 are not directly in fluid communication with each other, as shown, the second tank 200 and the third tank 300 are indirectly in fluid communication with each other via the first portion 410 and the second portion 420 of the channel structure 400 and the first tank 100.

In this embodiment, the first channel 411 and the second channel 421 are straight channels, but the disclosure is not limited thereto; in some other embodiments, the first channel and the second channel may be curved channels.

In this embodiment, the first portion 410 is longer than the second portion 420, but the disclosure is not limited thereto; in some other embodiments, the first portion may be shorter than the second portion.

Figure 5:
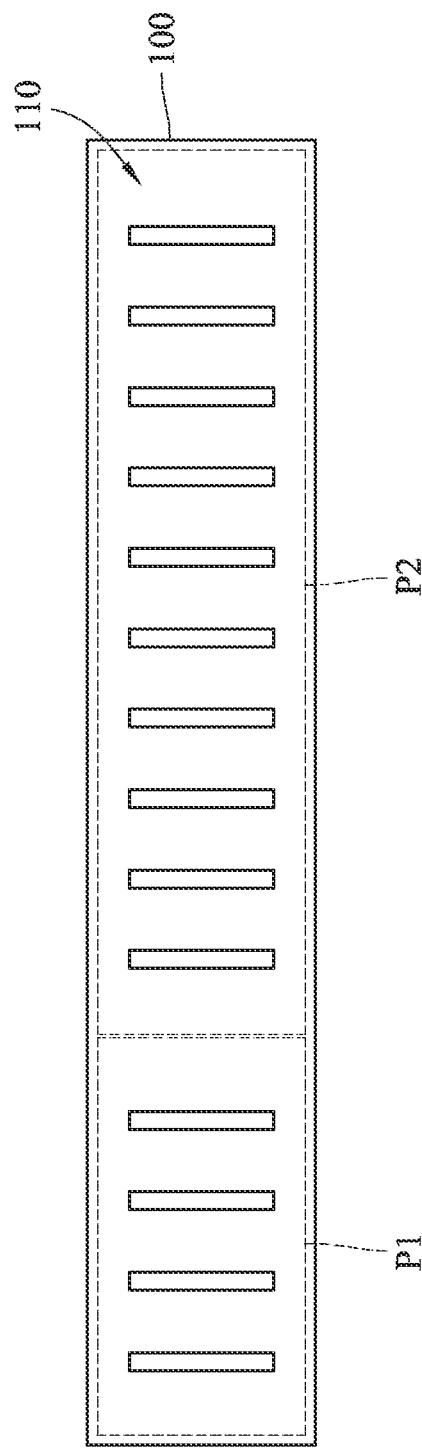
FIG. 5 shows orthogonal projections of a second tank and a third tank onto a surface of a first tank of the liquid cooling device in FIG. 3.

Further referring to FIG. 5, it shows orthogonal projections P1 and P2 of the second tank 200 and the third tank 300 onto the surface 110 of the first tank 100 of the liquid cooling device 20 in FIG. 3. In this embodiment, the second tank 200 and the third tank 300 is located at the same side of the first tank 100, and the second tank 200 is located farther away from the first tank 100 than the first tank 100. The orthogonal projection P1 of the second tank 200 onto the surface 110 of the first tank 100 and the orthogonal projection P2 of the third tank 300 onto the same surface 110 of the first tank 100 do not overlap with each other.

In this embodiment, the high-temperature coolant enters into the second tank 200 from the first connector 240 (along the direction F), and then it flows through the first portion 410 of the channel structure 400, the first tank 100, the second portion 420 of the channel structure 400, and the third tank 300. This path ensures a significant temperature reduction of the coolant. As such, the coolant returning to the heat absorbing component 10 is relatively low in temperature, achieving the desired performance of heat-absorbing from the heat source 21.

In this embodiment, the second tank 200 and the third tank 300 are in fluid communication with each other via the channel structure 400 and the first tank 100, and the orthogonal projection P1 of the second tank 200 onto the first tank 100 and the orthogonal projection P2 of the third tank 300 onto the first tank 100 do not overlap with each other, such that the second tank 200 and the channel structure 400 are not located at a side of the third tank 300 away from the first tank 100. Thus, the second tank 200 is in fluid communication with the side of the third tank 300 located close to the first tank 100 via the channel structure 400 and the first tank 100, instead of being in direct fluid communication with the side of the third tank 300 located away from the first tank 100. This ensures that the coolant flowing through the third tank 300 is low-temperature, preventing the converging of high-temperature and low-temperature coolant from existing in the third tank 300. Therefore, the turbulence due to interaction of high and low temperature coolant is prevented, improving the heat dissipation performance of the liquid cooling device 20.

Note that the flowing direction of the coolant is not intended to limit the disclosure; in some other embodiments, the flowing direction of the coolant may be opposite to the that of the flowing direction shown in FIG. 4. In such a case, the high-temperature coolant may enter the third tank from the first connector, then it flows through the second portion of the channel structure, the first tank, the first portion of the channel structure, and the second tank. As such, the coolant returning to the heat absorbing component is relatively low in temperature, achieving the desired performance of heat-absorbing from the heat source.

In this embodiment, the heat absorbing component 10 can be arranged within the recess S of the channel structure 400, achieving a small volume and compact arrangement of the liquid cooling system 1. In addition, the first opening direction O1 of the first connector 240 is perpendicular to the extension direction E of the first channels 411 of the first portion 410, and the second opening direction O2 of the second connector 340 is parallel to the extension direction E of the first channels 411 of the first portion 410; that is, the first opening direction O1 of the first connector 240 is perpendicular to the second opening direction O2 of the second connector 340. In this embodiment, the first opening direction O1 and the second opening direction O2 point towards the space (i.e., the recess S) for accommodating the heat absorbing component 10, facilitating the arrangement of the pipes 30 between the heat absorbing component 10 and the liquid cooling device 20.

Note that the direction of the first opening direction O1 of the first connector 240 is not limited to be perpendicular to the second opening direction O2 of the second connector 340; in some other embodiments, the first opening direction of the first connector may be the same as or different from the second opening direction of the second connector.

In this embodiment, the first portion 410 further includes a plurality of first heat dissipation fins 4111. The first heat dissipation fins 4111 are in contact with two of the first channels 411 that are adjacent to each other. The second portion 420 includes a plurality of second heat dissipation fins 4211. The second heat dissipation fins 4211 are in contact with two of the second channels 421 that are adjacent to each other. The first heat dissipation fins 4111 and the second heat dissipation fins 4211 can increase the heat dissipation performance of the liquid cooling device 20.

Note that the disclosure dose not limit the fins are connected to two of the channels that are adjacent to each other; in some other embodiments, the fins may not be connected to two of the channels that are adjacent to each other. In addition, the quantities of the first channel 411 and the second channel 421 may be modified as required and are not intended to limit the disclosure; in some other embodiment, the first portion may have only one first channel, and the second portion may have only one second channel.

Figure 6:
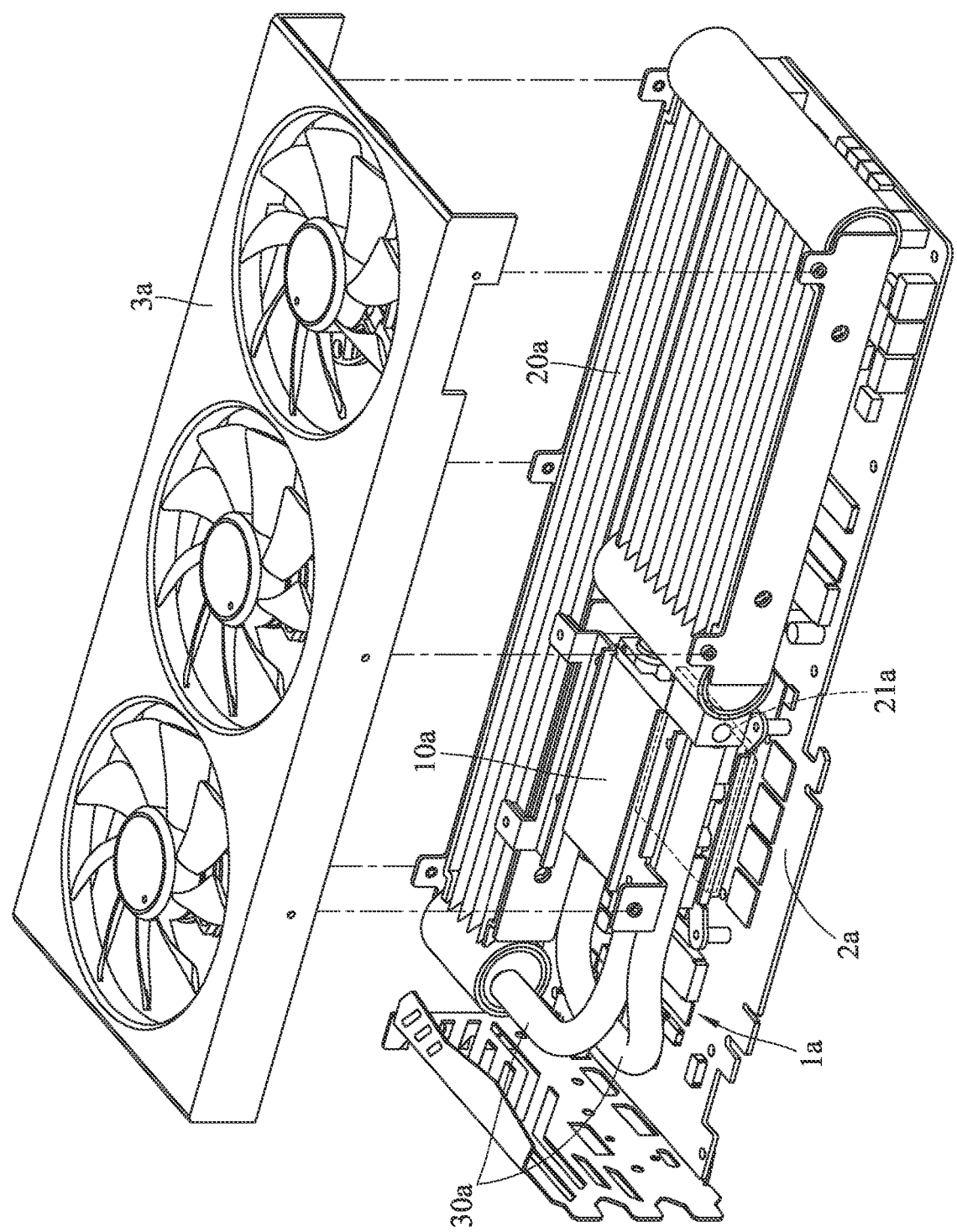
FIG. 6 is an exploded view of a liquid cooling system according to a second embodiment of the disclosure.
Figure 7:
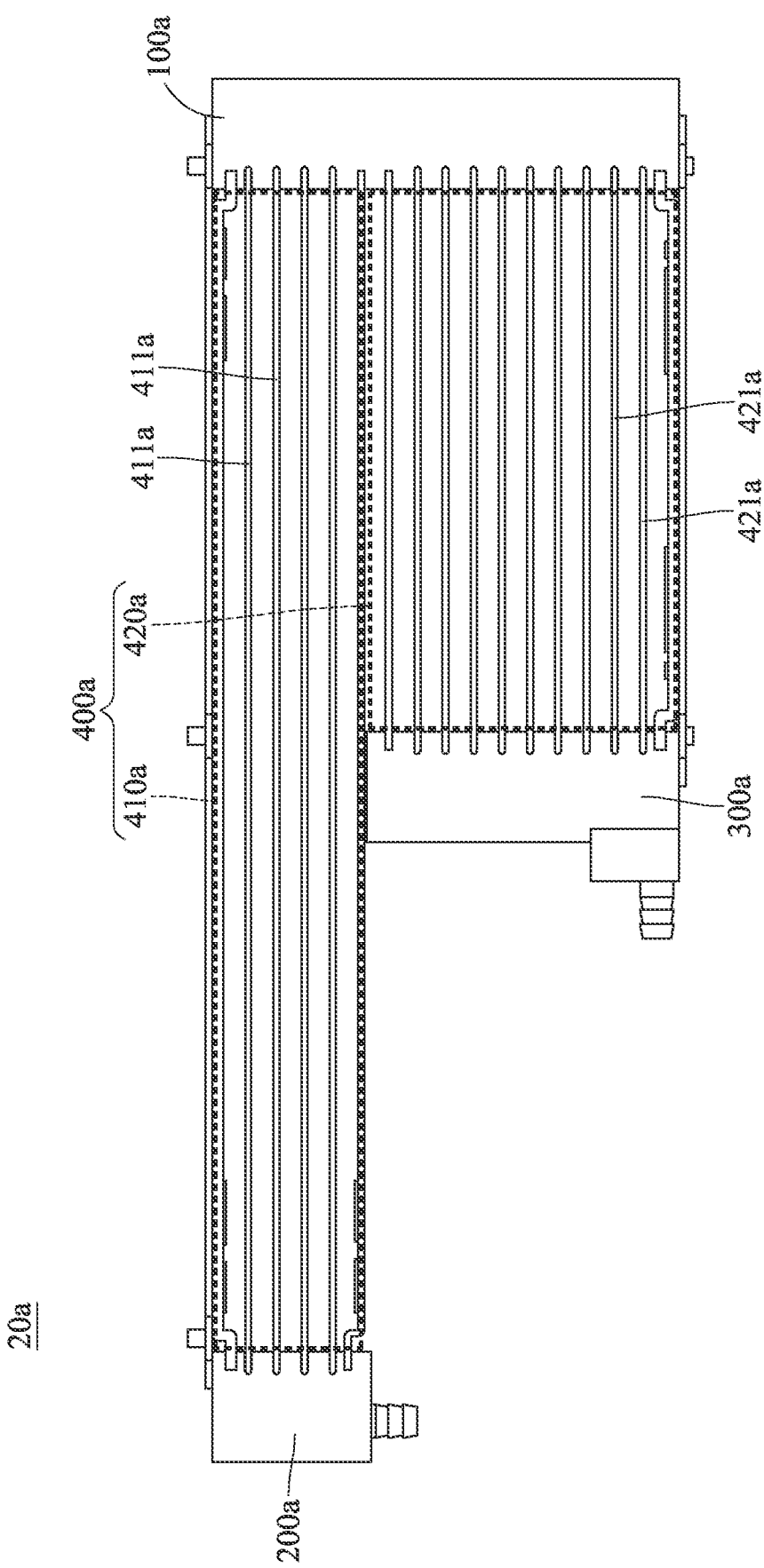
FIG. 7 is a schematic view of a liquid cooling device of the liquid cooling system in FIG. 6.

Note that the first heat dissipation fins 4111 and 4211 are optional. Referring to FIGS. 6 and 7, there are shown an exploded view of a liquid cooling system according to a second embodiment of the disclosure and a schematic view of a liquid cooling device 20a of the liquid cooling system in FIG. 6.

In this embodiment, the liquid cooling device 20a is in fluid communication with a heat absorbing component 10a via pipes 30a. The heat absorbing component 10a is in thermal contact with a heat source 21a of an electronic device 2a. In addition, the liquid cooling device 20 is cooperated with a fan device 3a. The fan device 3a can create airflow to take the heat away from the liquid cooling device 20a.

The liquid cooling device 20a includes a first tank 100a, a second tank 200a, a third tank 300a, and a channel structure 400a. The first tank 100a, the second tank 200a, and the third tank 300a of this embodiment is similar to that of the previous embodiment, thus the following paragraphs will not repeatedly introduce them hereinafter.

In this embodiment, the channel structure 400a is similar to the channel structure 400 of the previous embodiment, and the main difference between them is that a first portion 410a and a second portion 420a of the channel structure 400a have no any heat dissipation fin, and merely and respectively have a plurality of first channels 411a and a plurality of second channels 421a. The channel structure 400a can be cooperated with a heat source that produces less heat. Since there is no any heat dissipation fin in the channel structure 400a, the channel structure 400a can have a lightweight and be economically manufactured.

Figure 8:
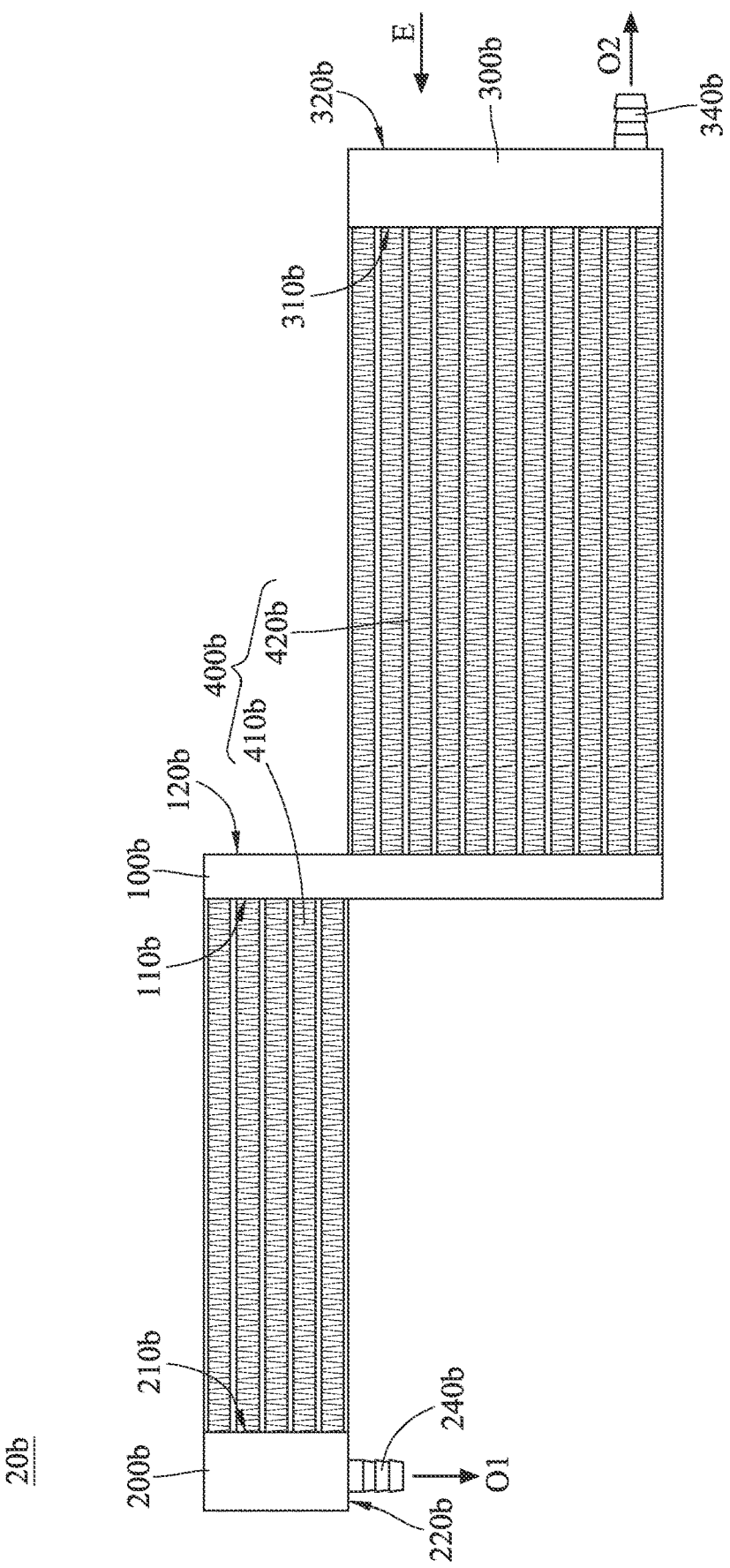
FIG. 8 is a schematic view of a liquid cooling device according to a third embodiment of the disclosure.

Note that disclosure does not limit the second tank 200 and the third tank 300 are located at the same side of the first tank 100. Referring to FIG. 8, there is shown a schematic view of a liquid cooling device 20b according to a third embodiment of the disclosure.

In this embodiment, the liquid cooling device 20b includes a first tank 100b, a second tank 200b, a third tank 300b, and a channel structure 400b. The first tank 100b has a first surface 110b and a second surface 120b located opposite to each other.

The second tank 200b has a first surface 210b, a second surface 220b adjacent to the first surface 210b, and a first connector 240b located at the second surface 220b.

The third tank 300b has a first surface 310b, a second surface 320b, and a second connector 340b. The second surface 320b is located opposite to first surface 310b. The second connector 340b is located at the second surface 320b. The first connector 240b and the second connector 340b are respectively in fluid communication with two connectors of a heat absorbing component (not shown) via two pipes (not shown).

The channel structure 400b includes a first portion 410b and a second portion 420b that are not directly connected to each other. The length of the first portion 410b is different from that of the second portion 420b, and the first portion 410b and the second portion 420b are not directly in fluid communication with each other. In this embodiment, the length of the first portion 410b is smaller than that of the second portion 420b, but the disclosure is limited thereto; in some other embodiments, the first portion and the second portion may have the same length.

Specifically, the first surface 110b of the first tank 100b and the first surface 210b of the second tank 200b are respectively connected to two opposite ends of the first portion 410b of the channel structure 400b. The second surface 120b of the first tank 100b and the first surface 310b of the third tank 300b are respectively connected to two opposite ends of the second portion 420b of the channel structure 400b. In other words, the second tank 200b and the third tank 300b are respectively located two opposite sides of the first tank 100b, and the second tank 200b is not directly in fluid communication with the third tank 300b, as shown, the second tank 200 is in fluid communication with the third tank 300b via the first portion 410b and the second portion 420b of the channel structure 400b and the first tank 100b.

In this embodiment, the orthogonal projection of the second tank 200b onto the first surface 110b of the first tank 100b and the orthogonal projection of the third tank 300b onto the first surface 110b of the first tank 100b do not overlap with each other (as shown in FIG. 5). As such, It prevents the converging of high-temperature and low-temperature coolant from existing in the third tank 300b. Therefore, the turbulence due to interaction of high and low temperature coolant is prevented, improving the heat dissipation performance of the liquid cooling device 20b.

In this embodiment, the channels of the first portion 410b and the second portion 420b are straight channels, but the present disclosure is not limited thereto; in some other embodiments, the channels of the first portion and the second portion may be curved channels.

In this embodiment, the first opening direction O1 of the first connector 240b is perpendicular to the extension direction E of the channels of the first portion 410b, and the second opening direction O2 of the second connector 340b is parallel to the extension direction E of the channels of the first portion 410b; that is, the first opening direction O1 of the first connector 240b is perpendicular to the second opening direction O2 of the second connector 340b.

Figure 9:
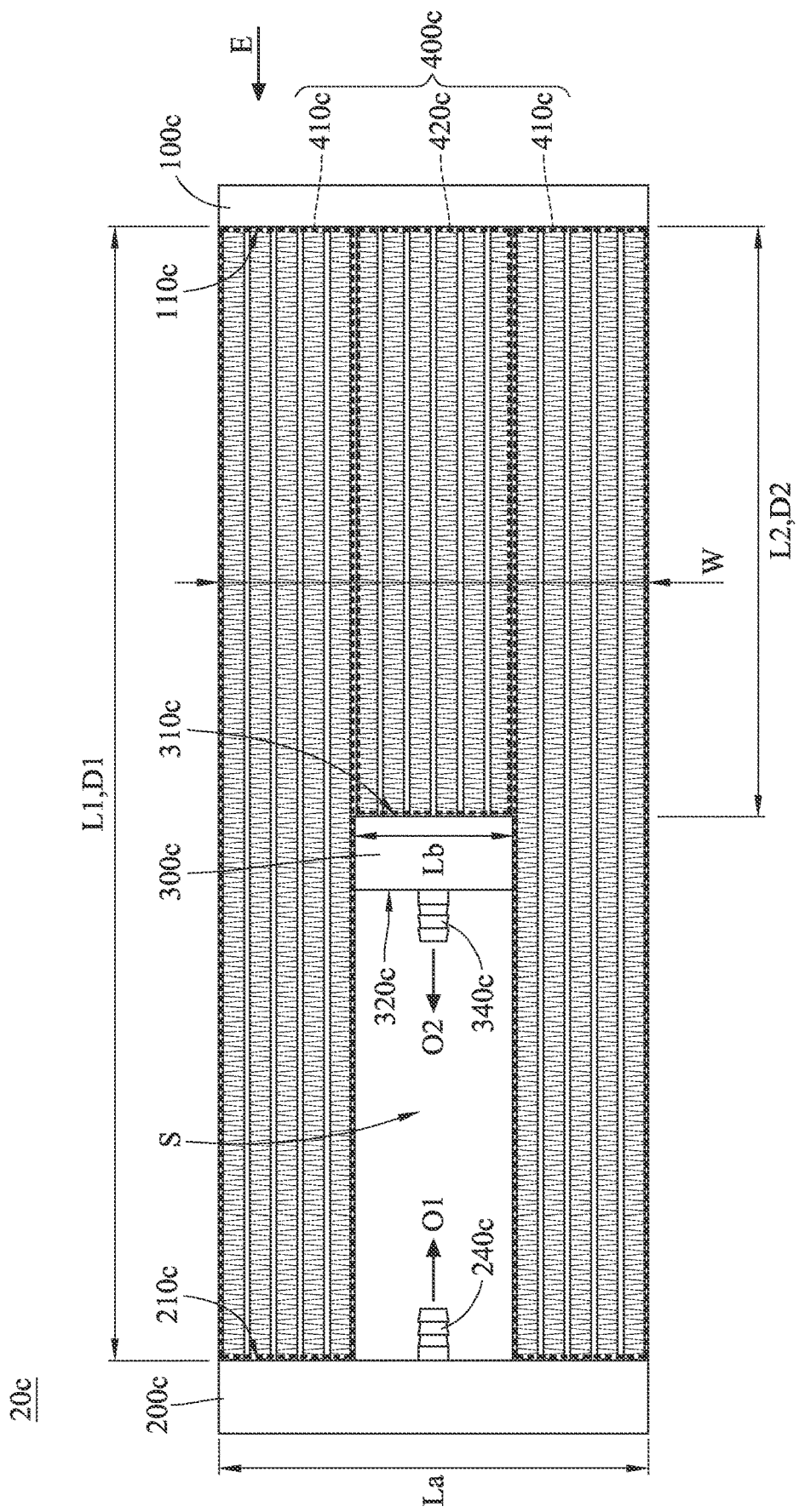
FIG. 9 is a schematic view of a liquid cooling device according to a fourth embodiment of the disclosure.

Note that the non-overlapped orthogonal projections of the second tank 200 and the third tank 300 onto the surface 110 of the first tank are not intended to limit the disclosure. Referring to FIG. 9, there is shown a schematic view of a liquid cooling device 20c according to a fourth embodiment of the disclosure.

In this embodiment, the liquid cooling device 20c includes a first tank 100c, a second tank 200c, a third tank 300c, and a channel structure 400c. The first tank 100c has a surface 110c.

The second tank 200c has a surface 210c and a first connector 240c located at the surface 210c.

The third tank 300c has a first surface 310c, a second surface 320c located opposite to the first surface 310c, and a second connector 340c located at the second surface 320c. The first connector 240c and the second connector 340c are respectively in fluid communication with two connectors of a heat absorbing component (not shown) via two pipes (not shown). The length Lb of the third tank 300c is, for example, smaller than the length La of the second tank 200c.

The channel structure 400c includes two first portions 410c and a second portion 420c located between and connected to the first portions 410c. The first portions 410c are not directly in fluid communication with the second portion 420c. The length L1 of each of the first portions 410c is larger than the length L2 of the second portion 420c, such that the distance D1 between the second tank 200c and the first tank 100c is larger than the distance D2 between the third tank 300c and the first tank 100c.

Specifically, the surface 110c of the first tank 100c and the surface 210c of the second tank 200 are respectively connected to two opposite ends of each of the first portions 410c of the channel structure 400c. The surface 110c of the first tank 100c and the first surface 310c of the third tank 300c are respectively connected to the second portion 420c of the channel structure 400c. In other words, the third tank 300c is located between the first tank 100c and the second tank 200c, and the second tank 200 is not directly in fluid communication with the third tank 300c; as shown, the second tank 200 is in fluid communication with the third tank 300c via the first portions 410c and the second portion 420c of the channel structure 400 and the first tank 100c.

In this embodiment, the orthogonal projection of the second tank 200c onto the surface 110c of the first tank 100c and the orthogonal projection of the third tank 300c onto the surface 110c of the first tank 100c partially overlap with each other. Since the distance between the second tank 200c and the first tank 100c is larger than the distance between the third tank 300c and the first tank 100c, and the length Lb of the third tank 300c is smaller than the maximum width of the channel structure 400c, such that there is a room formed between the second tank 200c and the third tank 300c to accommodate the heat absorbing component 10c. As such, it prevents the converging of high-temperature and low-temperature coolant from existing in the third tank 300c. Therefore, the turbulence due to interaction of high and low temperature coolant is prevented, improving the heat dissipation performance of the liquid cooling device 20c.

In this embodiment, channels of the first portion 410c and the second portion 420c are straight channels, but the disclosure is not limited thereto; in some other embodiments, the channels of the first portion and the second portion are curved channels.

In this embodiment, the first opening direction O1 of the first connector 240c and the second opening direction O2 of the second connector 340c are parallel to the extension direction E of the channels of the first portion 410c.

Figure 10:
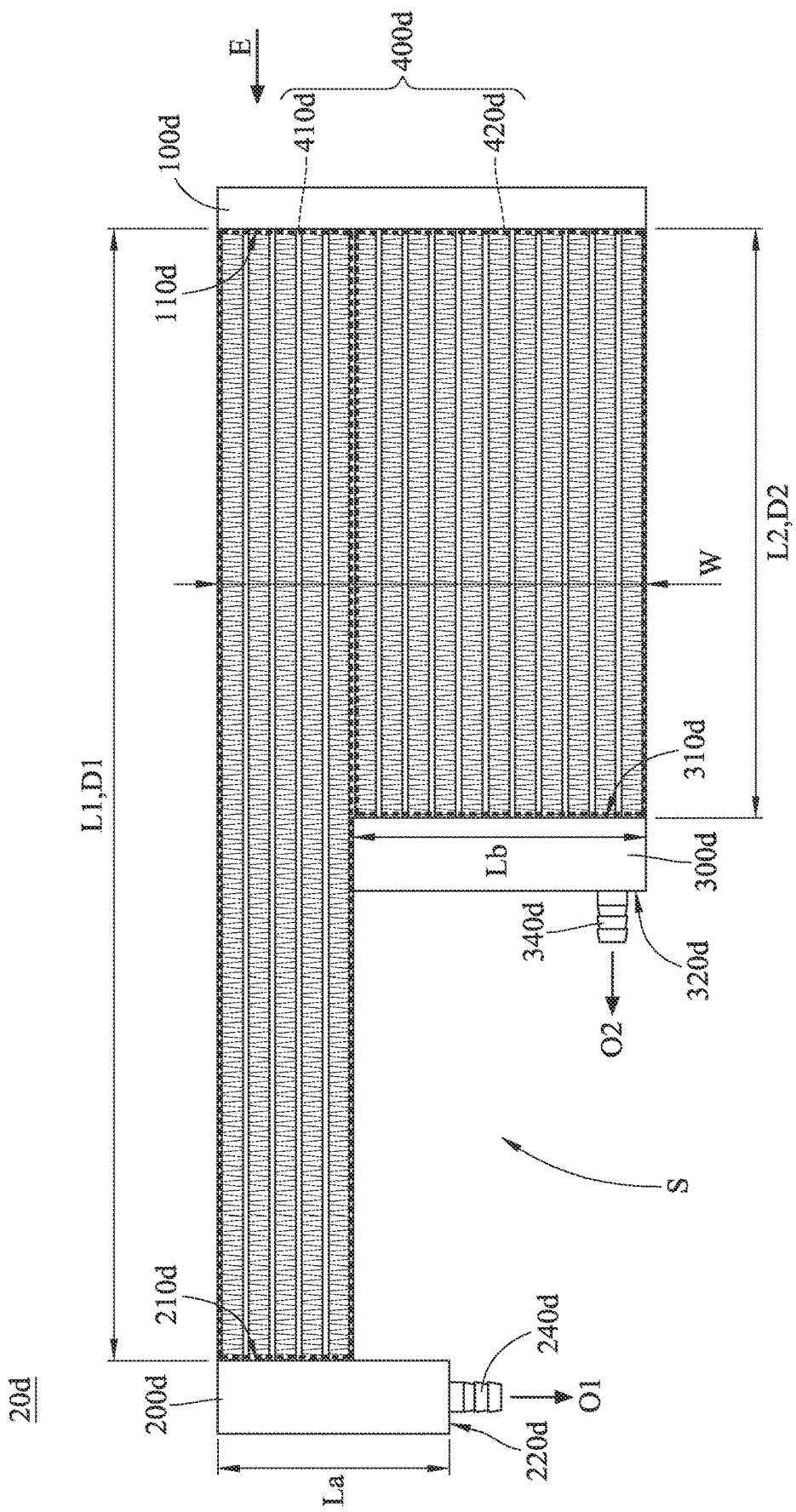
FIG. 10 is a schematic view of a liquid cooling device according to a fifth embodiment of the disclosure.

Then, referring to FIG. 10, there is shown a schematic view of a liquid cooling device 20d according to a fifth embodiment of the disclosure.

In this embodiment, the liquid cooling device 20d includes a first tank 100d, a second tank 200d, a third tank 300d, and a channel structure 400d. The first tank 100d has a surface 110d.

The second tank 200d has a first surface 210d, a second surface 220d adjacent to the first surface 210d, and a first connector 240d located at the second surface 220d.

The third tank 300d has a first surface 310d, a second surface 320d located opposite to the first surface 310d, and a second connector 340d located at the second surface 320d. The first connector 240d and the second connector 340d are respectively in fluid communication with two connectors of a heat absorbing component (not shown) via two pipes (not shown). The length Lb of the third tank 300d is, for example, larger than the length La of the second tank 200d.

The channel structure 400d includes a first portion 410d and a second portion 420d connected to each other, and the first portion 410d and the second portion 420d are not directly in fluid communication with each other. The length L1 of the first portion 410d is larger than the length L2 of the second portion 420d, such that the distance D1 between the second tank 200d and the first tank 100d is larger than the distance D2 between the third tank 300d and the first tank 100d.

Specifically, the surface 110d of the first tank 100d and the first surface 210d of the second tank 200d are respectively connected to two opposite ends of the first portion 410 of the channel structure 400d. The surface 110d of the first tank 100d and the first surface 310d of the third tank 300d are respectively connected to two opposite ends of the second portion 420d of the channel structure 400d. In other words, the third tank 300d is located between the first tank 100d and the second tank 200d, and the second tank 200d is not directly in fluid communication with the third tank 300d; as shown, the second tank 200 is in fluid communication with the third tank 300d via the first portion 410d and the second portion 420d of the channel structure 400d and the first tank 100d.

In this embodiment, the orthogonal projection of the second tank 200d onto the surface 110d of the first tank 100d and the orthogonal projection of the third tank 300d onto the surface 110d of the first tank 100d partially overlap with each other. Since the distance D1 between the second tank 200d and the first tank 100d is larger than the distance D2 between the third tank 300d and the first tank 100d, and the length Lb of the third tank 300d is smaller than the maximum width W of the channel structure 400d, such that there is a room formed between the second tank 200d and the third tank 300d to accommodate the heat absorbing component 10. As such, it prevents the converging of high-temperature and low-temperature coolant from existing in the third tank 300d. Therefore, the turbulence due to interaction of high and low temperature coolant is prevented, improving the heat dissipation performance of the liquid cooling device 20d.

In this embodiment, channels of the first portion 410d and the second portion 420d are straight channels, but the disclosure is not limited thereto; in some other embodiment, the channels of the first portion and the second portion may be curved channels.

In this embodiment, the first opening direction O1 of the first connector 240d is perpendicular to the extension direction E of the channels of the first portion 410d, and the second opening direction O2 of the second connector 340d is parallel to the extension direction E of the channels of the first portion 410d; that is, the first opening direction O1 of the first connector 240d is perpendicular to the second opening direction O2 of the second connector 340d.

Figure 11:
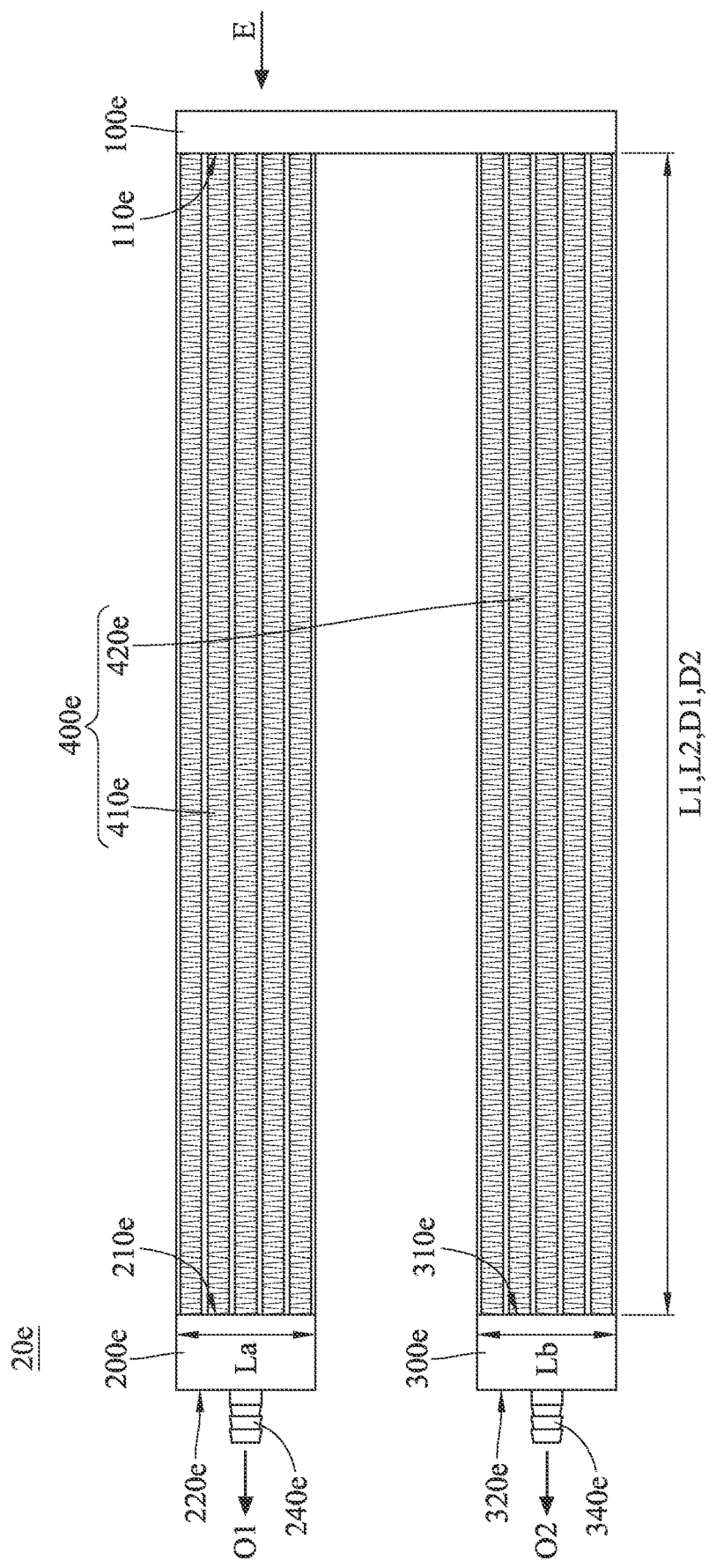
FIG. 11 is a schematic view of a liquid cooling device according to a sixth embodiment of the disclosure.

In the previous embodiment, the second tank 200 and the third tank 300 are located at the same side of the first tank 100, but the disclosure is not limited thereto. Referring to FIG. 11, there is shown a schematic view of a liquid cooling device 20e according to a sixth embodiment of the disclosure.

In this embodiment, the liquid cooling device 20e includes a first tank 100e, a second tank 200e, a third tank 300e, and a channel structure 400e. The first tank 100e has a surface 110e.

The second tank 200e has a first surface 210e, a second surface 220e located opposite to the first surface 210e, and a first connector 240e located at the second surface 220e.

The third tank 300e has a first surface 310e, a second surface 320e located opposite to the first surface 310e, and a second connector 340e located at the second surface 320e. The first connector 240e and the second connector 340e are respectively in fluid communication with two connectors of a heat absorbing component (not shown) via two pipes (not shown). The length Lb of the third tank 300e is, for example, larger than the length La of the second tank 200e.

The channel structure 400e includes a first portion 410e and a second portion 420e connected to each other, and the first portion 410e is not directly in fluid communication with the second portion 420e. The length L1 of the first portion 410e is equal to the length L2 of the second portion 420e, such that the distance D1 between the second tank 200e and the first tank 100e is equal to the distance D2 between the third tank 300e and the first tank 100e.

Specifically, the surface 110e of the first tank 100e and the first surface 210e of the second tank 200e are respectively connected to two opposite ends of the first portion 410e of the channel structure 400e. The surface 110e of the first tank 100e and the first surface 310e of the third tank 300e are respectively connected to two opposite ends of the second portion 420e of the channel structure 400e. In other words, the third tank 300e is located between the first tank 100e and the second tank 200e, and the second tank 200e is not directly in fluid communication with the third tank 300e; as shown, the second tank 200e is in fluid communication with the third tank 300e via the first portion 410e and the second portion 420e of the channel structure 400e and the first tank 100e.

In this embodiment, the orthogonal projection of the second tank 200e onto the surface 110e of the first tank 100e and the orthogonal projection of the third tank 300e onto the surface 110e of the first tank 100e do not overlap with each other, and the channel structure 400e is not located between the second tank 200e and the third tank 300e, such that it prevents the converging of high-temperature and low-temperature coolant from existing in the third tank 300e. Therefore, the turbulence due to interaction of high and low temperature coolant is prevented, improving the heat dissipation performance of the liquid cooling device 20e.

In this embodiment, channels of the first portion 410e and the second portion 420e are straight channels; but the disclosure is not limited thereto; in some other embodiments, the channels of the first portion and the second portion may be curved channels.

In this embodiment, the first opening direction O1 of the first connector 240e and the second opening direction O2 of the second connector 340e are parallel to the extension direction E of the first portion 410e.

Figure 12:
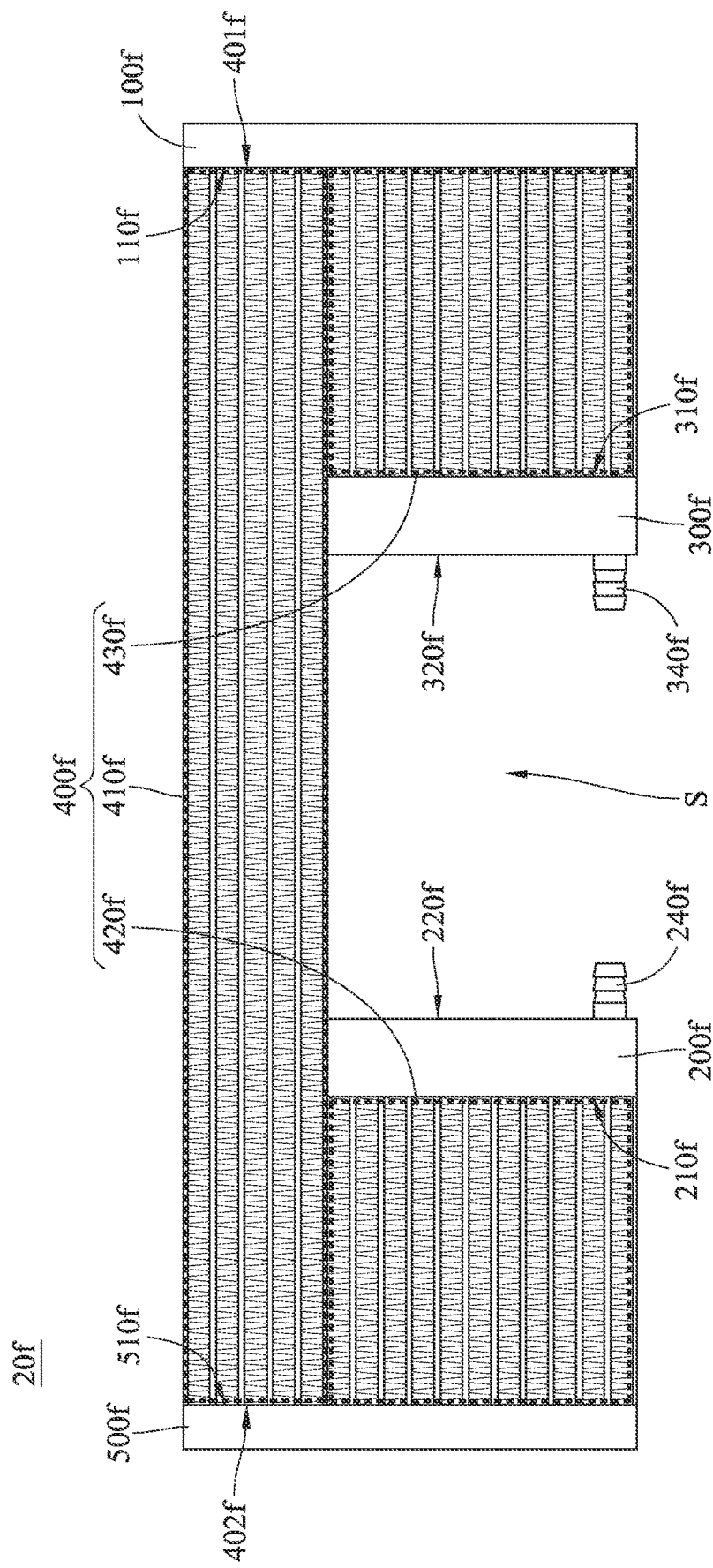
FIG. 12 is a schematic view of a liquid cooling device according to a seventh embodiment of the disclosure.

Then, referring to FIG. 12, there is shown a schematic view of a liquid cooling device 20f according to a seventh embodiment of the disclosure.

In this embodiment, the liquid cooling device 20f includes a first tank 100f, a second tank 200f, a third tank 300f, a fourth tank 500f, and a channel structure 400f. The first tank 100f has a surface 110f.

The second tank 200f has a first surface 210f, a second surface 220f located opposite to the first surface 210f, and a first connector 240f located at the second surface 220f.

The third tank 300f has a first surface 310f, a second surface 320f located opposite to the first surface 310f, and a second connector 340f located at the second surface 320f. The first connector 240f and the second connector 340f are respectively in fluid communication with connectors of a heat absorbing component 10 (not shown) via two pipes (not shown). The length of the third tank 300f is, for example, equal to the length of the second tank 200f. The fourth tank 500f has a surface 510f.

The channel structure 400f has a first side 401f, a second side 402f, and a recess S. The recess S is located between the first side 401f and the second side 402f. In specific, the channel structure 400f includes a first portion 410f, a second portion 420f, and a third portion 430f connected to one another. The second portion 420f and the third portion 430f are arranged at a side of the first portion 410f and abutted with the first portion 410f, and the recess S is located between the second portion 420f and the third portion 430f. The first portion 410f, the second portion 420f, and the third portion 430f are not directly in fluid communication with each other. The length of the first portion 410f is larger than the length of the second portion 420f.

Specifically, a side of the first portion 410f and a side of the third portion 430f are connected to the surface 110f of the first tank 100f, and the other side of the first portion 410f and a side of the second portion 420f are connected to the surface 510f of the fourth tank 500f. The first surface 210f of the second tank 200f is connected to a side of the second portion 420f located away from the fourth tank 500f, and the first surface 310f of the third tank 300f is connected to a side of the third portion 430f located away from the first tank 100f. In other words, the second tank 200f and the third tank 300f are between the first tank 100f and the fourth tank 500f, and the second tank 200f is not directly in fluid communication with the third tank 300f; as shown, the second tank 200f is in fluid communication with the third tank 300f via the first portion 410f, the second portion 420f, and the third portion 430f, the first tank 100f, and the fourth tank 500f. More specifically, the second tank 200 is in fluid communication with the fourth tank 500f via the second portion 420f of the channel structure 400f, the fourth tank 500f is in fluid communication with the first tank 100f via the first portion 410f of the channel structure 400f, and the first tank 100f is in fluid communication with the third tank 300f via the third portion 430f of the channel structure 400f.

In this embodiment, the orthogonal projection of the second tank 200f onto the surface 110f of the first tank 100f and the orthogonal projection of the third tank 300f onto the surface 110f of the first tank 100f completely overlap with each other. The second tank 200f and the third tank 300f are located in the recess S and spaced apart from each other by a gap, and the gap between the second tank 200f and the third tank 300f are configured to accommodate the heat absorbing component. As such, it prevents the converging of high-temperature and low-temperature coolant from existing in the third tank 300f. Therefore, the turbulence due to interaction of high and low temperature coolant is prevented, improving the heat dissipation performance of the liquid cooling device 20f.

In this embodiment, channels of the first portion 410f, the second portion 420f, and the third portion 430f are straight channels, but the disclosure is not limited thereto; in some other embodiments, the channels of the first portion, the second portion, and the third portion may be curved channels.

In this embodiment, the first opening direction O1 of the first connector 240f and the second opening direction O2 of the second connector 340f are parallel to the extension direction E of the channels of the first portion 410.

The aforementioned liquid cooling devices are exemplary and not intended to limit the disclosure, and the embodiments of the disclosure sufficiently support the scopes of each independent claim. For example, the embodiments of FIGS. 3, 7, 8, 11 reflect that the orthogonal projections of the second tank and the third tank onto the first tank do not overlap with each other. The embodiments of FIGS. 3, 7, 9, 10 and 12 reflect that the distance between the second tank and the first tank is larger than the distance between the third tank and the first tank, and the length of the third tank is smaller than the maximum width of the channel structure.

The embodiments of FIGS. 3, 7, 9, 10, 11, and 12 reflect that the channel structure is not located between the second tank and the third tank. The embodiments of FIGS. 3, 7, 8, 9, 10, and 12 reflect that the channel structure has a recess, the third tank is entirely located in the recess, and the recess is configured to accommodate the heat absorbing component. The embodiments of FIGS. 3, 7, 8, 9, 10, and 12 reflect that the third tank is located between the first tank and the second tank, and the third tank only has one side directly in fluid communication with the channel structure.

As the liquid cooling devices and the liquid cooling systems discussed in the above embodiments, the second tank and the third tank are in fluid communication with the first tank via the channel structure, and the orthogonal projections of the second tank and the third tank onto the first tank do not overlap with each other, such that the second tank and the channel structure are not located at a side of the third tank located away from the first tank. Thus, the second tank is in fluid communication with the side of the third tank located close to the first tank via the channel structure and the first tank instead of being in direct fluid communication with the side of the third tank located away from the first tank. This ensures that the coolant flowing through the third tank is low-temperature, preventing the converging of high-temperature and low-temperature coolant from existing in the third tank. Therefore, the turbulence due to interaction of high and low temperature coolant is prevented, improving the heat dissipation performance of the liquid cooling device.

In addition, the distance between the second tank and the first tank is larger than the distance between the third tank and the first tank, and the length of the third tank is smaller than the maximum width of the channel structure, such that there is a room formed between the second tank and the third tank to accommodate the heat absorbing component. As such, it prevents the converging of high-temperature and low-temperature coolant from existing in the third tank. Therefore, the turbulence due to interaction of high and low temperature coolant is prevented, improving the heat dissipation performance of the liquid cooling device.

On the other hand, the third tank is located at the recess, and the second tank and the third tank are spaced apart from each other by a gap, such that it prevents the converging of high-temperature and low-temperature coolant from existing in the third tank. Therefore, the turbulence due to interaction of high and low temperature coolant is prevented, improving the heat dissipation performance of the liquid cooling device.

In some of the embodiments, the heat absorbing component can be arranged within the recess of the channel structure, achieving a small volume and compact arrangement of the liquid cooling system.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A liquid cooling device, configured to be in fluid communication with a heat absorbing component, comprising:
   a first tank, a second tank and a third tank, wherein the second tank has a first connector, the third tank has a second connector, and the first connector and the second connector are configured to be in fluid communication with the heat absorbing component via pipes; and
   a channel structure, wherein the second tank and the third tank are in fluid communication with the first tank via the channel structure;
   wherein orthogonal projections of the second tank and the third tank onto the first tank do not overlap with each other;
   wherein a first opening direction of the first connector is non-parallel to a second opening direction of the second connector;
   wherein the channel structure has a recess, the heat absorbing component is positioned in the recess, the third tank is located at the recess of the channel structure, a length of the recess is substantially a half of a length of the channel structure, and a width of the recess is greater than a half of a width of the channel structure.

2. The liquid cooling device according to claim 1, wherein the second tank and the third tank are located the same side of the first tank, and a distance between the second tank and the first tank is different from a distance between the third tank and the first tank.

3. The liquid cooling device according to claim 1, wherein the channel structure comprises a first portion and a second portion, the first portion and the second portion are not directly in fluid communication with each other, the second tank is in fluid communication with the first tank via the first portion of the channel structure, and the third tank is in fluid communication with the first tank via the second portion of the channel structure.

4. The liquid cooling device according to claim 3, wherein a length of the first portion is larger than a length of the second portion, such that a distance between the second tank and the first tank is larger than a distance between the third tank and the first tank.

5. The liquid cooling device according to claim 4, and a room located at a side of the third tank located away from the first tank is configured to accommodate the heat absorbing component.

6. The liquid cooling device according to claim 3, wherein the first opening direction of the first connector is perpendicular to the second opening direction of the second connector.

7. The liquid cooling device according to claim 6, wherein the first portion comprises at least one first channel in fluid communication with the first tank, the second portion comprises at least one second channel in fluid communication with the first tank, the first opening direction of the first connector is perpendicular to an extension direction of the at least one first channel of the first portion, and the second opening direction of the second connector is parallel to the extension direction of the at least one first channel of the first portion.

8. The liquid cooling device according to claim 7, wherein the first portion further comprises a plurality of first heat dissipation fins connected to the at least one first channel, and the second portion further comprises a plurality of second heat dissipation fins connected to the at least one second channel.

9. The liquid cooling device according to claim 8, wherein the at least one first channel comprises a plurality of first channels, the at least one second channel comprises a plurality of second channels, the plurality of first heat dissipation fins are connected to two of the plurality of first channels that are adjacent to each other, and the plurality of second heat dissipation fins are connected to two of the plurality of second channels that are adjacent to each other.

10. The liquid cooling device according to claim 1, wherein the second tank and the third tank are respectively located at different sides of the first tank.

11. A liquid cooling device, configured to be in fluid communication with a heat absorbing component, comprising:
a first tank, a second tank and a third tank, wherein the second tank has a first connector, the third tank has a second connector, and the first connector and the second connector are configured to be in fluid communication with the heat absorbing component via pipes; and
a channel structure, wherein the second tank and the third tank are in fluid communication with the first tank via the channel structure;
wherein a distance between the second tank and the first tank is larger than a distance between the third tank and the first tank, and a length of the third tank is smaller than a maximum width of the channel structure;
wherein a first opening direction of the first connector is non-parallel to a second opening direction of the second connector;
wherein the channel structure has a recess, the heat absorbing component is positioned in the recess, the third tank is located at the recess of the channel structure, a length of the recess is substantially a half of a length of the channel structure, and a width of the recess is greater than a half of a width of the channel structure.

12. The liquid cooling device according to claim 11, wherein an orthogonal projection of the third tank onto the first tank partially overlap with an orthogonal projection of the second tank onto the first tank.

13. The liquid cooling device according to claim 11, wherein an orthogonal projection of the third tank onto the first tank completely overlap with an orthogonal projection of the second tank onto the first tank.

14. The liquid cooling device according to claim 11, wherein the channel structure comprises a first portion and a second portion, the first portion and the second portion are not directly in fluid communication with each other, the second tank is in fluid communication with the first tank via the first portion of the channel structure, and the third tank is in fluid communication with the first tank via the second portion of the channel structure.

15. The liquid cooling device according to claim 14, wherein the first opening direction of the first connector is perpendicular to the second opening direction of the second connector.

16. The liquid cooling device according to claim 15, wherein the first portion comprises at least one first channel in fluid communication with the first tank, the second portion comprises at least one second channel in fluid communication with the first tank, the first opening direction of the first connector is perpendicular to an extension direction of the at least one first channel of the first portion, and the second opening direction of the second connector is parallel to the extension direction of the at least one first channel of the first portion.

17. The liquid cooling device according to claim 16, wherein the first portion further comprises a plurality of first heat dissipation fins, the plurality of first heat dissipation fins are connected to the at least one first channel, the second portion further comprises a plurality of second heat dissipation fins, and the plurality of second heat dissipation fins are connected to the at least one second channel.

18. The liquid cooling device according to claim 17, wherein the at least one first channel comprises a plurality of first channels, the at least one second channel comprises a plurality of second channels, the plurality of first heat dissipation fins are connected to two of the plurality of first channels that are adjacent to each other, the plurality of second heat dissipation fins are connected to two of the plurality of second channels that are adjacent to each other.

19. The liquid cooling device according to claim 11, wherein a length of the third tank is larger than a length of the second tank.

20. The liquid cooling device according to claim 11, wherein a length of the second tank is larger than a length of the third tank.

21. The liquid cooling device according to claim 20, wherein the channel structure comprises two first portions and a second portion, the second portion is located between the two first portions, the two first portions and the second portion are not directly in fluid communication with each other, the second tank is in fluid communication with the first tank via the two first portions of the channel structure, and the third tank is in fluid communication with the first tank via the second portion of the channel structure.

22. A liquid cooling device, configured to be in fluid communication with a heat absorbing component, comprising:
a first tank;
a second tank;
a third tank, wherein the second tank has a first connector, the third tank has a second connector, the first connector and the second connector are configured to be in fluid communication with the heat absorbing component via pipes; and
a channel structure, wherein the second tank and the third tank are in fluid communication with the first tank via the channel structure;
wherein the channel structure has a recess, the third tank is entirely located in the recess, and the heat absorbing component is positioned in the recess;
wherein a first opening direction of the first connector is non-parallel to a second opening direction of the second connector;
wherein a length of the recess is substantially a half of a length of the channel structure, and a width of the recess is greater than a half of a width of the channel structure.

* * * * *